United States Patent
Tong et al.

(10) Patent No.: US 8,741,698 B2
(45) Date of Patent: Jun. 3, 2014

(54) ATOMIC LAYER DEPOSITION OF ZIRCONIUM OXIDE FOR FORMING RESISTIVE-SWITCHING MATERIALS

(75) Inventors: Jinhong Tong, Santa Clara, CA (US);
Vidyut Gopal, Sunnyvale, CA (US);
Imran Hashim, Saratoga, CA (US);
Randall Higuchi, San Jose, CA (US);
Albert Lee, Cupertino, CA (US)

(73) Assignees: Intermolecular, Inc., San Jose, CA (US); Kabushiki Kaisha Toshiba, Tokyo (JP); SanDisk 3D LLC, Milpitas, CA (US)

( * ) Notice: Subject to any disclaimer, the term of this patent is extended or adjusted under 35 U.S.C. 154(b) by 0 days.

(21) Appl. No.: 13/306,096

(22) Filed: Nov. 29, 2011

(65) Prior Publication Data

US 2013/0134376 A1    May 30, 2013

(51) Int. Cl.
*H01L 21/332* (2006.01)

(52) U.S. Cl.
USPC ........ 438/133; 438/104; 257/2; 257/E21.078; 257/E47.001

(58) Field of Classification Search
USPC .............. 257/2, E21.078, E47.001; 438/104, 438/257, 133
See application file for complete search history.

(56) References Cited

U.S. PATENT DOCUMENTS

| | | | |
|---|---|---|---|
| 7,084,078 B2 | 8/2006 | Ahn et al. | |
| 7,122,415 B2 | 10/2006 | Jang et al. | |
| 7,508,648 B2 | 3/2009 | Ahn et al. | |
| 2008/0044569 A1 | 2/2008 | Myo | |
| 2009/0302296 A1* | 12/2009 | Fuchigami et al. | 257/2 |
| 2010/0052097 A1* | 3/2010 | Eun | 257/532 |
| 2010/0227476 A1 | 9/2010 | Peck | |

OTHER PUBLICATIONS

Chen, P., et al.; HfOx Thin Films for Resistive Memory Device by Use of Atomic Layer Deposition; Jan. 1, 2007; Industrial Technology Research Institute; Mater. Res. Soc. Symp. Proc. vol. 997 2007 Materials Research Society.

Kim, S., et al.; High dielectric constant TiO2 thin films on a Ru electrode grown at 250 Cby AtomicLayer Deposition; Nov. 1, 2004; Seoul National University Industry Foundation; Applied Physics Letters V.85 N.18 1112004.

Kuo et. al.; Characterization of nonstoichiometric TiO2 and ZrO2 thin films stabilized by Al2O3 and SiO2 additions; Jan. 1, 2003; Academia—National Dong Hwa University, Taiwan; J. Vac. Sci. Technol. A 21?6? Nov.Dec. 2003.

Lee, D., et al.; Resistance Switching of the Nonstoichiometric Zirconium Oxide for Nonvolatile Memory Applications; Oct. 1, 2005; IEEE; Electronic Device Letters vol. 26 No. 9 pp. 719721.

Kim, Y.M., et al.; Characteristics of Atomic Layer Deposition Grown HfO2 Films After Exposure to Plasma Treatments; Jan. 1, 2007; Kookje Electric Korea Co. Ltd; Thin Solid Films pp. 29842989.

(Continued)

*Primary Examiner* — Elias M Ullah

(57) ABSTRACT

Atomic layer deposition (ALD) can be used to form a dielectric layer of zirconium oxide for use in a variety of electronic devices. Forming the dielectric layer includes depositing zirconium oxide using atomic layer deposition. A method of atomic layer deposition to produce a metal-rich metal oxide comprises the steps of providing a silicon substrate in a reaction chamber, pulsing a zirconium precursor for a predetermined time to deposit a first layer, and oxidizing the first layer with water vapor to produce the metal-rich metal oxide. The metal-rich metal oxide has superior properties for non-volatile resistive-switching memories.

18 Claims, 3 Drawing Sheets

(56) References Cited

OTHER PUBLICATIONS

Goldstein, D., et al.; Al2O3 Atomic Layer Deposition with Trimethylauminum and Ozone Studied by in Situ Transmission FTIR Spectroscopy and Quadrupole Mass Spectrometry; Jan. 1, 2008; The Regents of the University of Colorado; J. Phys. Chem pp. 1953019539.

Bartholomew, L., et al.; Advanced Process Control of HfxSi1xO2 Composition Using CoInjection Atomic Layer Deposition; Jan. 1, 2009; The Electrochemical Society; ECS Transactions pp. 567574.

Yanguas-Gil, A., et al.; Controlled Dopant Distribution and Higher Doping Efficiencies by SurfaceFunctionalized Atomic Layer Deposition; Jan. 1, 2011; Z-Book—American Chemical Society; Chemistry of Materials 3 pages.

Yun, et al.; Dependence of atomic layerdeposited Al2O3 films characteristics on growth temperature and Al precursors of AlCH33 and AlCl3; Jul. 25, 1997; Vacuum Society; Semiconductor Technology Division Electronics and Telecommunications Research Institute.

Groner, M.D., et al.; Electrical characterization of thin Al2O3 films grown by atomic layer deposition on silicon and various metal substrates; Apr. 19, 2002; Z-Book—Elsevier; Thin Solid Films 413 186197.

Min, YS., et al.; Atomic Layer Deposition of Al2O3 Thin Films from a 1Methoxy2methyl2propoxide Complex of Aluminum and Water; Jan. 7, 2005; American Chemical Societyunknown; Chem. Mater. 2005 17 626631.

JD Ferguson et al.; ALD of SiO2 at Room Temperature Using TEOS and ?H?2?O with ?nh?3 as the Catalyst; Jan. 1, 2004; Journal of the Electrochemical Society; Unknown.

S.H. Lin et al.; HighDensityandLowLeakageCurrentMIMCapacitorUsingStacked TiO2ZrO2Insulators; Jul. 1, 2009; IEEE; Unknown.

\* cited by examiner

ATOMIC LAYER DEPOSITION OF ZIRCONIUM OXIDE FOR FORMING RESISTIVE-SWITCHING MATERIALS

FIELD OF THE INVENTION

The present invention relates generally to resistive-switching material for non-volatile memory devices, and particularly related to layer formation techniques such as atomic layer deposition of zirconium oxides.

BACKGROUND OF THE INVENTION

Nonvolatile memory elements are used in systems in which persistent storage is required. For example, digital cameras use nonvolatile memory cards to store images and digital music players use nonvolatile memory to store audio data. Nonvolatile memory is also used to persistently store data in computer environments.

Nonvolatile memory is often formed using electrically-erasable programmable read only memory (EEPROM) technology. This type of nonvolatile memory contains floating gate transistors that can be selectively programmed or erased by application of suitable voltages to their terminals.

As fabrication techniques improve, it is becoming possible to fabricate nonvolatile memory elements with increasingly smaller dimensions. However, as device dimensions shrink, scaling issues are posing challenges for traditional nonvolatile memory technology. This has led to the investigation of alternative nonvolatile memory technologies, including resistive switching nonvolatile memory.

Resistive switching nonvolatile memory is formed using memory elements that have two or more stable states with different resistances. Bistable memory has two stable states. A bistable memory element can be placed in a high resistance state or a low resistance state by application of suitable voltages or currents. Voltage pulses are typically used to switch the memory element from one resistance state to the other. Nondestructive read operations can be performed to ascertain the value of a data bit that is stored in a memory cell.

Resistive switching based on transition metal oxide switching elements formed of metal oxide (MO) films has been demonstrated. Although metal oxide (MO) films such as these exhibit bistability, the resistance of these films and/or the ratio of the high-to-low resistance states is (are) often insufficient to be of use within a practical nonvolatile memory device. For instance, the resistance states of the metal oxide film should preferably be significant as compared to that of the system (e.g., the memory device and associated circuitry) so that any change in the resistance state change is perceptible. Since the variation in the difference in the resistive states is related to the resistance of the resistive switching layer, it is often hard to use a low resistance metal oxide film to form a reliable nonvolatile memory device. For example, in a nonvolatile memory that has conductive lines formed of a relatively high resistance metal such as tungsten, the resistance of the conductive lines may overwhelm the resistance of the metal oxide resistive switching element if its resistance was not sufficiently high. This may make it difficult or impossible to sense the state of the bistable metal oxide resistive switching element. Similar issues can arise from integration of the resistive switching memory element with current steering elements, such as diodes and/or resistors. The resistance of the resistive switching memory element (at least in its high resistance state) is preferably significant compared to the resistance of the current steering elements, so that the unvarying resistance of the current steering element does not dominate the resistance of the switching memory element, and thus reduce the measurable difference between the "on" and "off" states of the formed memory device (i.e., logic states of the device). However, since the power that can be delivered to a circuit containing a series of resistive switching memory elements and current steering elements is typically limited in most conventional nonvolatile memory devices (e.g., CMOS driven devices), it is desirable to form each of the resistive switching memory elements and current steering elements in the circuit so that the voltage drop across each of these elements is small, and thus resistance of the series connected elements does not cause the current to decrease to an undesirable level due to the fixed applied voltage (e.g., ~2-5 volts).

As nonvolatile memory device sizes shrink, it is important to reduce the required currents and voltages that are necessary to reliably set, reset and/or determine the desired "on" and "off" states of the device to minimize overall power consumption of the memory chip as well as resistive heating of the device and cross-talk between adjacent devices. Moreover, as nonvolatile memory device sizes shrink it becomes increasing necessary to assure that the "set" and "reset" currents used to change the state of the memory element are not too large so as to require higher voltage transistors for chip control circuitry, as well to minimize damage to or alter the electrical or physical properties of the one or more layers found in the formed memory device. A large current flowing through the current carrying lines in a memory array can also undesirably alter or disturb the memory state of other interconnected devices or possibly damage portions of the adjacently connected devices, due to an appreciable amount of "cross-talk" created between them due to resistive heat transfer. Therefore, there is a need to limit and/or minimize the required current used to sense and program the logic states of each of the interconnected devices in an effort to reduce chip overall power consumption as well as improve device longevity and reduce the chance that cross-talk between adjacently connected devices, which can alter a nonvolatile memory's device state. Therefore, it is desirable to form a nonvolatile memory device that has low programming currents when switching the device between the "on" and "off" states.

SUMMARY OF THE DESCRIPTION

The following summary of the invention is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

A novel resistive-switching material for a semiconductor device and method for atomic layer deposition to manufacture the resistive-switching material are disclosed. The resistive-switching material is a metal-rich metal oxide, such as zirconium oxide. Accordingly, a semiconductor device comprises a first electrode, such as a poly-silicon substrate, a metal oxide film may then be deposited onto the first electrode by atomic layer deposition (ALD). A zirconium precursor may be pulsed into an ALD reactor, followed by purging with an inert gas to remove the excess precursor from the processing chamber. Then an oxidizer, may be pulsed into the chamber to oxidize the metal precursor. The resistive switching material is formed as a metal rich oxide ($MO_x$) where x is less than 2.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which.

DETAILED DESCRIPTION

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

According to some embodiments, resistive-switching memory elements can be formed that use resistive-switching metal oxide layers. According to some embodiments, a metal-insulator-metal (MIM) memory element can be formed from two electrodes and one or more layers of metal oxide materials disposed there-between. In some embodiments, metal oxide layers can be formed using atomic layer deposition (ALD). The ALD process parameters and materials can be optimized to reduce the forming voltage and increase the site yield of memory elements described herein. For example, the purge duration, the substrate temperature of the deposition process, and metal materials can be optimized.

Figure 1:
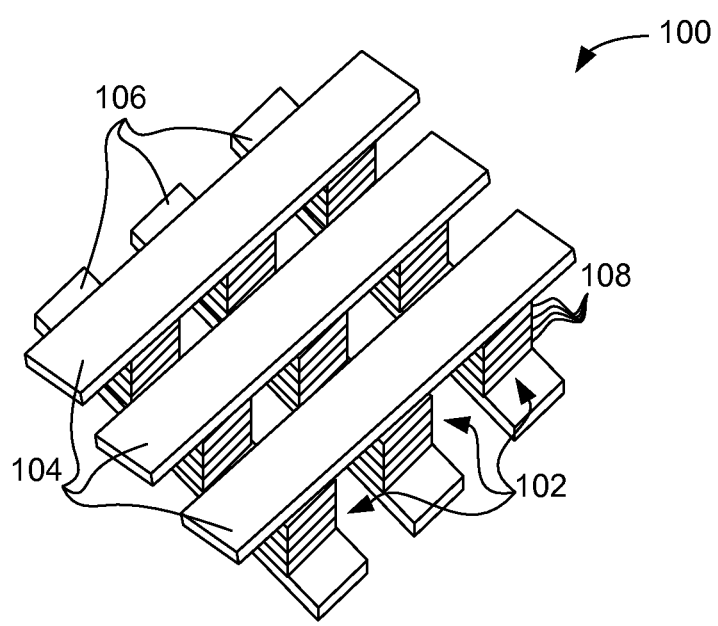
FIG. 1 illustrates an array of resistive switching memory elements in accordance with an embodiment of the invention.

FIG. 1 illustrates a memory array 100 of resistive-switching memory elements 102. Memory array 100 may be part of a memory device or other integrated circuit. Read and write circuitry may be connected to memory elements 102 using signal lines 104 and orthogonal signal lines 106. Signal lines such as signal lines 104 and signal lines 106 are sometimes referred to as word lines and bit lines and are used to read and write data into the elements 102 of array 100. Individual memory elements 102 or groups of memory elements 102 can be addressed using appropriate sets of signal lines 104 and 106. Memory element 102 may be formed from one or more layers 108 of materials. In addition, the memory arrays shown can be stacked in a vertical fashion to make multi-layer 3-D memory arrays.

Any suitable read and write circuitry and array layout scheme may be used to construct a nonvolatile memory device from resistive-switching memory elements such as element 102. For example, horizontal and vertical lines 104 and 106 may be connected directly to the terminals of resistive-switching memory elements 102. This is merely illustrative.

If desired, other electrical devices may be associated (i.e., be one or more of the layers 108) with each memory element 102. These devices, which are sometimes referred to as current steering elements, may include, for example, diodes, p-i-n diodes, silicon diodes, silicon p-i-n diodes, transistors, etc. Current steering elements may be connected in series in any suitable locations in memory element 102.

During a read operation, the state of a memory element 102 can be sensed by applying a sensing voltage (i.e., a "read" voltage) to an appropriate set of signal lines 104 and 106. Depending on its history, a memory element that is addressed in this way may be in either a high resistance state or a low resistance state. The resistance of the memory element therefore determines what digital data is being stored by the memory element. If the memory element has a high resistance, for example, the memory element may be said to contain a logic zero (i.e., a "0" bit). If, on the other hand, the memory element has a low resistance, the memory element may be said to contain a logic one (i.e., a "1" bit). During a write operation, the state of a memory element can be changed by application of suitable write signals to an appropriate set of signal lines 104 and 106.

Figure 2A:
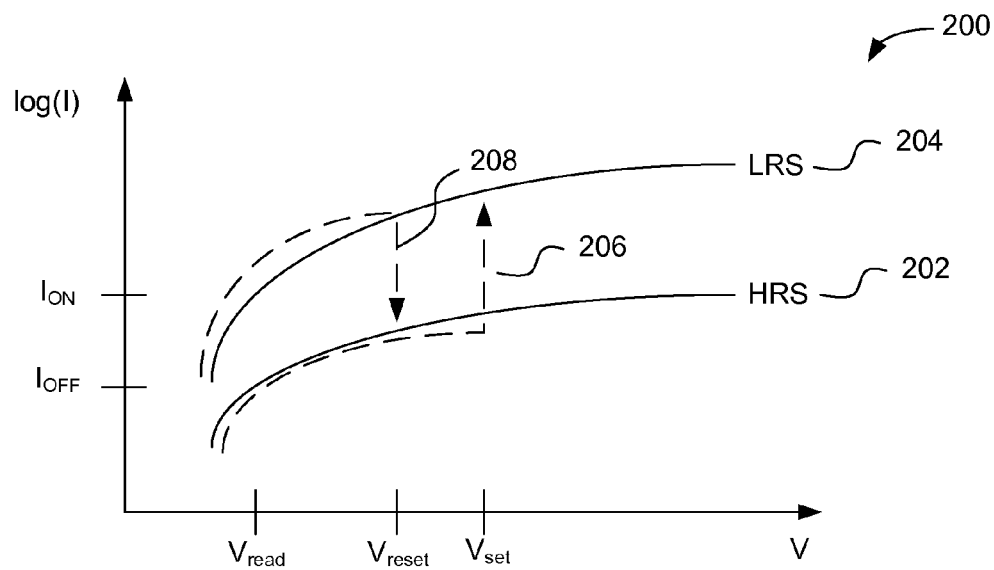
FIG. 2A is a logarithmic plot of current (I) versus voltage (V) for a memory element according to some embodiments of the present invention.

FIG. 2A is a logarithmic plot of current (I) versus voltage (V) 200 for a memory element 102. FIG. 2A illustrates the set and reset operations to change the contents of the memory element 102. Initially, memory element 102 may be in a high resistance state ("HRS", e.g., storing a logic zero). In this state, the current versus voltage characteristic of memory element 102 is represented by solid line HRS 202. The high resistance state of memory element 102 can be sensed by read and write circuitry using signal lines 104 and 106. For example, read and write circuitry may apply a read voltage $V_{READ}$ to memory element 102 and can sense the resulting "off" current $I_{OFF}$ that flows through memory element 102. When it is desired to store a logic one in memory element 102, memory element 102 can be placed into its low-resistance state. This may be accomplished by using read and write circuitry to apply a set voltage $V_{SET}$ across signal lines 104 and 106. Applying $V_{SET}$ to memory element 102 causes memory element 102 to switch to its low resistance state, as indicated by dashed line 206. In this region, the memory element 102 is changed so that, following removal of the set voltage $V_{SET}$, memory element 102 is characterized by low resistance curve LRS 204. As is described further below, the change in the resistive state of memory element 102 may be because of the filling of traps (i.e., a may be "trap-mediated") in a metal oxide material.

The low resistance state of memory element 102 can be sensed using read and write circuitry. When a read voltage $V_{READ}$ is applied to resistive switching memory element 102, read and write circuitry will sense the relatively high "on" current value $I_{ON}$, indicating that memory element 102 is in its low resistance state. When it is desired to store a logic zero in memory element 102, the memory element can once again be placed in its high resistance state by applying a reset voltage $V_{RESET}$ to memory element 102. When read and write circuitry applies $V_{RESET}$ to memory element 102, memory element 102 enters its high resistance state HRS, as indicated by dashed line 208. When the reset voltage $V_{RESET}$ is removed from memory element 102, memory element 102 will once again be characterized by high resistance line HRS 204. Voltage pulses can be used in the programming of the memory element 102.

A forming voltage $V_{FORM}$ is a voltage applied to the memory element 102 to ready the memory element 102 for use. Some memory elements described herein may need a forming event that includes the application of a voltage greater than or equal to the set voltage or reset voltage. Once the memory element 102 initially switches, the set and reset voltages can be used to change the resistance state of the memory element 102. A lower forming voltage may be desirable (e.g. less than 5 volts) to reduce the likelihood of damage to the memory element. As is described herein, certain process techniques can be used to form memory elements that have lower forming voltages.

The bistable resistance of resistive-switching memory element 102 makes memory element 102 suitable for storing digital data. Because no changes take place in the stored data in the absence of application of the voltages $V_{SET}$ and $V_{RESET}$, memory formed from elements such as element 102 is non-volatile. As can be appreciated, it is desirable for memory element 102 to have a large difference between off current and on current (i.e., a high $I_{ON}/I_{OFF}$ ratio), which causes the on and off states of the memory element to be more discrete and easily detectable.

In its most basic form, the layers 108 of the memory element 102 include two electrodes (each having one or more materials and/or layers) and one or more layers of one or more metal oxides disposed in between. The memory element 102 generally has a metal-insulator-metal (MIM) capacitor structure, although other structures such as metal-insulator-insulator-metal (MIIM) and metal-insulator-insulator-insulator-metal (MIIIM) can be used.

Without being bound by theory, in some embodiments the memory element 102 may use a switching mechanism that is mediated in the bulk of the metal oxide. Generally, defects are formed in, already exist in the deposited metal oxide, and existing defects can be enhanced by additional processes. Defects may take the form of variances in charge in the structure of the metal oxide. For example, some charge carriers may be absent from the structure (i.e., vacancies) or additional charge carriers may be present (i.e., interstitials). Therefore, by applying a voltage to the memory element 102, the defects, such as traps, can either be filled or emptied to alter the resistivity of a metal oxide and resistive-switching memory elements can be formed using these principles.

The metal oxides may be of any phase, including crystalline and amorphous. The deposited metal oxides can have vacancy defects such as different level of oxygen vacancy defects created by depositing metal rich zirconium oxide film, vacancies (missing atoms), and interstitials (extra atoms). Amorphous-phase metal oxides may have increased resistivity, which in some embodiments can lower the operational currents of the device to reduce potential damage to the memory element 102.

Figure 2B:
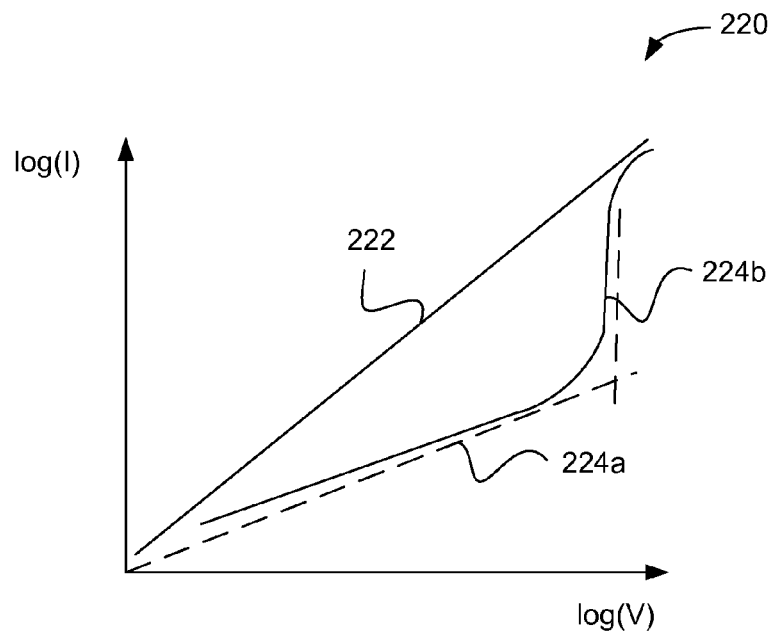
FIG. 2B is a logarithmic plot of current (I) versus voltage (V) plot for a memory element that illustrates a resistance state change according to some embodiments of the present invention.

FIG. 2B is a logarithmic plot of current (I) versus voltage (V) 220 for a memory element 102 that demonstrates a resistance state change. The plot 220 shows a voltage ramp applied to the memory element 102 along the x-axis and the resulting current along a y-axis. The line 222 represents the response of an Ohmic material when the ramped voltage is applied. An Ohmic response is undesirable, since there is no discrete voltage at which the set or reset occurs.

Generally, a more abrupt graph like graph 224 is desired. The graph 224 begins with an Ohmic response 224a, and then curves sharply upward 224b. The graph 224 may represent a set operation, where the memory element 102 switches from the HRS 202 to the LRS 204.

Without being bound by theory, non-metallic percolation paths are formed during a set operation and broken during a reset operation. For example, during a set operation, the memory element 102 switches to a low resistance state. The percolation paths that are formed by filling traps increase the conductivity of the metal oxide, thereby reducing (i.e., changing) the resistivity. The voltage represented by 224b is the set voltage. At the set voltage, the traps are filled and there is a large jump in current as the resistivity of the metal oxide decreases.

The set voltage shown here is very discrete (i.e., vertical), which is desirable to ensure the switching of the memory element occurs at a repeatable voltage. Additionally, a high ratio of on current to off current (i.e., a high $I_{ON}/I_{OFF}$ ratio), for example 10 or greater, is desirable because it indicates a large difference in the resistivity of the metal oxide when in the HRS and LRS, making the state of the memory element easier to determine. Finally, it is desirable to have low set, reset, and forming voltages in order to avoid damage to the memory elements and to be compatible with complementary device elements such as diodes and/or transistors in series with the memory element 102.

The resistive-switching memory elements generally have a metal-insulator-metal (MIM) structure in which resistive-switching insulating layers are surrounded by two conductive electrodes. The resistive-switching layer includes a metal oxide (such as $HfO_x$, $ZrO_x$, $AlO_x$, $TiO_x$, $TaO_x$, etc.) layer or a film stack consisting of a metal oxide film as the host switching material with another metal oxide as the coupling layer.

Without being bound to theory, a number of models have been proposed for the driving mechanism in resistive-switching involving an interface-type conducting path, such as electrochemical migration of oxygen vacancies and trapping of charge carriers (hole or electron). The switching characteristics of the resistive-switching memory elements can be tailored by controlling the defects within the metal oxides. However, using conventional PVD deposition technique, it is difficult to vary metal oxide film composition and control defect concentrations, particularly for very thin films less than 50 Å. ALD is a deposition technique that produces high-quality films with precise thickness control and good conformality. By varying the precursor and oxidizer concentration, different film compositions of metal oxides can be achieved. Ozone is a typical oxidant used in the formation of metal oxide materials. If the metal oxide materials can be formed metal-rich instead of stoichiometric composition, the switching layer will have a deficit of oxygen, which manifests as oxygen vacancy defects.

Increasing the temperature of the precursor source increases the partial pressure of the precursor, which can result in a more metal-rich switching layer by increasing the concentration of the metal precursor in the chamber and in the film. In some embodiments of the present invention, water vapor or isopropyl alcohol is chosen as the oxidant source. These oxidants are not as aggressive as ozone and allow the metal to oxygen ratio to be controlled in the film. The partial pressure of the oxidant can be lowered by reducing the source temperature which reduces its vapor pressure. For example, water vapor has a vapor pressure of about 17.5 torr at 20 C and about 4.9 torr at 1 C. The partial pressure can also be reduced by diluting the oxidant with an inert gas such as argon. By using water vapor as the oxygen source (which is less reactive than other oxygen sources such as ozone) and reducing the vapor pressure for water vapor, the ALD process window can be extended. Since water vapor is less reactive than ozone, the use of water vapor reduces the formation of $SiO_x$ between the silicon substrate and the metal oxide during the process. For example, the $SiO_x$ layer formed between the substrate and the metal oxide may be as thin as about 10 A when water vapor is used as the oxidant. The formation of $SiO_x$ is an undesirable effect of the ALD process. A thicker $SiO_x$ layer results in a higher forming voltage of the resulting resistive-switching element.

Figure 3:
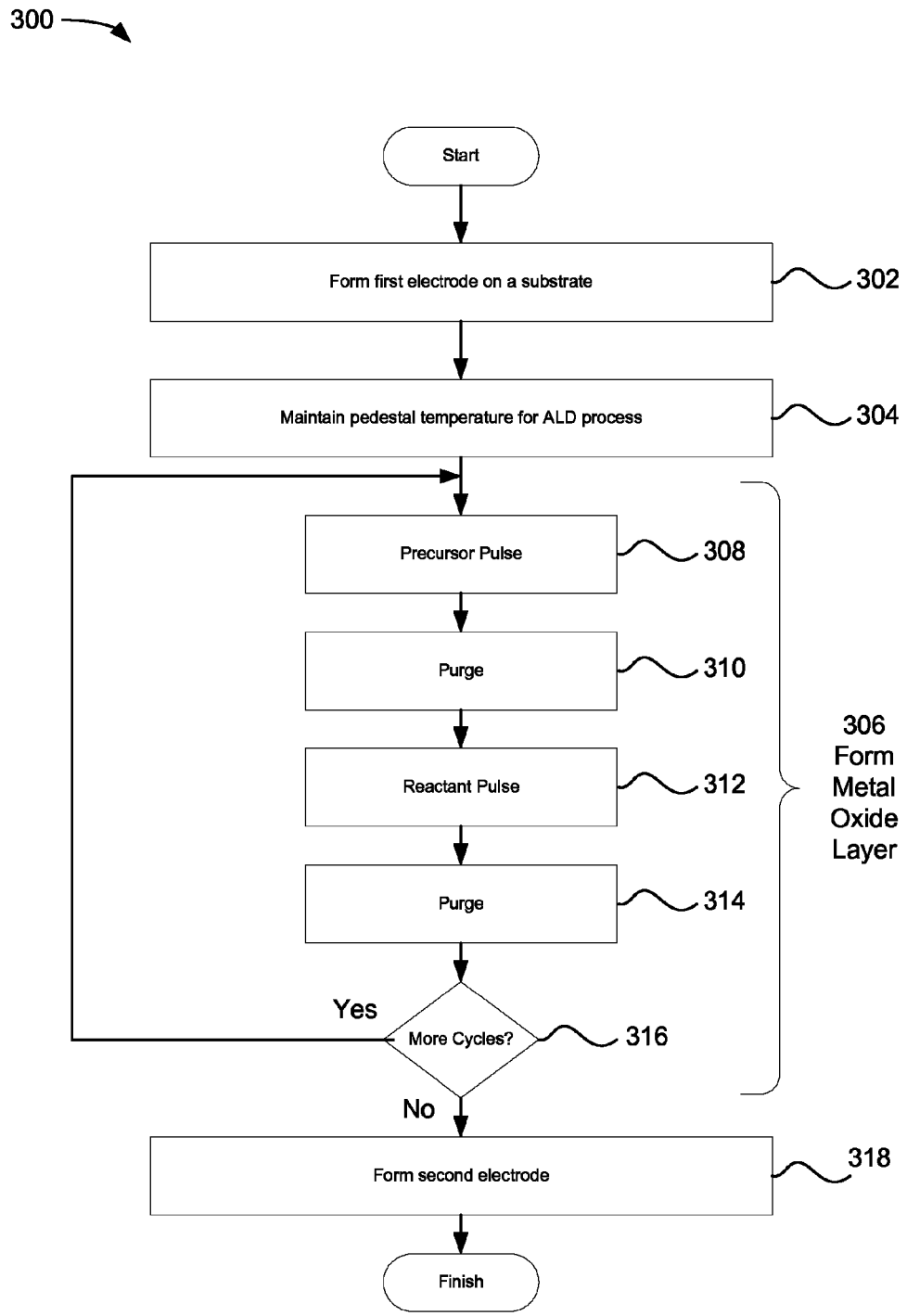
FIG. 3 illustrates a flowchart describing a process for forming a memory element according to some embodiments of the present invention.

FIG. 3 is a flowchart describing a process 300 for forming a memory element. The process 300 is a general description of techniques used to form the memory elements described above. The process 300 describes techniques for forming a memory element 102 generally including two electrodes and at least one layer of metal oxide disposed there-between. Although certain processing techniques and specifications are described, it is understood that various other techniques and modifications of the techniques described herein may also be used.

In operation 302, a first electrode is formed. The first electrode can be formed on a substrate, for example, a silicon substrate that may include one or more layers already formed thereon. The first electrode may be formed over a signal line such as a bit line or a word line. The first electrode can be poly-silicon, a silicide, titanium nitride, tungsten, or other appropriate material. In some embodiments, a titanium nitride electrode is formed using PVD or other suitable process. These descriptions are given as examples; the actual process conditions can vary greatly depending on the material to be deposited, the tool used to deposit the material, and the desired speed of deposition. Other processing techniques, such as ALD, PLD (pulsed laser deposition), CVD (chemical vapor deposition), evaporation, etc. can also be used to deposit the first electrode. In some embodiments, the first electrode is in contact with one of the signal lines 104 or 106. The first electrode may have any thickness, for example between about 10 A and about 2000 A.

In operation 304, the substrate is heated, for example by heating a pedestal on which the substrate is mounted in an ALD chamber. In this way, a pedestal temperature is maintained for an ALD deposition process so that the metal oxide layer(s) can be deposited. Typically, the substrate is heated to about 250 C.

In operation 306, at least one metal oxide layer is formed using ALD. The metal oxide layer can be a resistive-switching metal oxide layer, such as a high bandgap (i.e. greater than 4 eV) material including zirconium oxide, hafnium oxide, aluminum oxide, yttrium oxide, tantalum oxide, etc. ALD is a multi-step process used to deposit the materials. The operation 306 is a single ALD cycle. An ALD-deposited layer typically includes multiple cycles to deposit a layer of a desired thickness, so the process 306 is repeated until the desired layer thickness has been deposited. The metal oxide layer can include single metal oxide (i.e. zirconium oxide, hafnium oxide, aluminum oxide, etc.), can use co-injection or nanolaminates to deposit a binary metal oxide, or can use multiple layers of metal oxides. For example, a metal oxide "base" layer can be deposited over a metal oxide "diffusion barrier" layer. In other embodiments, three or more different layers of materials can be deposited.

In operation 308, a precursor pulse is applied to a substrate by introducing the first reagent into an ALD chamber. A portion of the precursor adsorbs onto the surface of the substrate. The precursor can be a metal-containing precursor that is used to form a metal oxide. For example, the first reagent can be tetrakis (ethylmethylamino) zirconium (TEMAZ) to deposit zirconium oxide, trimethylaluminum (TMA) to deposit an aluminum oxide layer, or tetrakis (diethylamido) hafnium (TDEAHf), tetrakis(dimethylamido)hafnium (TDMAHf), tetrakis(ethylmethylamido)hafnium (TEMAHf) or hafnium chloride ($HfCl_4$) to deposit a hafnium oxide layer, or tris(methylcyclopentadienyl)-yttrium $((Cp)_3)Y$ to deposit yttrium oxide. In other embodiments, lower bandgap (i.e. less than 4 eV) materials, such as titanium oxide, have also been shown to exhibit switching properties. Precursors such as tetraisopropoxide (TTIP) can be used to deposit titanium oxide.

In accordance with some embodiments of the present invention, ZyALD™ is used as the zirconium precursor. ZyALD™ is used only as an example; those skilled in the art will understand that any suitable ALD precursor may be used. Self-limited growth can be obtained up to the temperature of 350 C. ZyALD™ is available from Air Liquide having its headquarters in Paris, France. The ampoule temperature is set at approximately 90 C. In some embodiments, a pulse time of about 30 seconds was used for the precursor pulse in a carrier gas of Ar. The Ar carrier flow rate may be about 200 sccm.

In operation 310, the excess (non-adsorbed portion) of the precursor is purged, for example by purging the ALD chamber to remove excess precursor. In some embodiments, the purge time for the precursor may be about 70 seconds.

In operation 312, a reactant gas is applied to the substrate. The reactant gas combines with the adsorbed precursor to form a metal oxide. The reactant gas is an oxidizer, for example ozone, water vapor, isopropyl alcohol, or oxygen. In some embodiments, water vapor is used as the oxidizer. Water vapor is less reactive than other oxidizers such as ozone. Being less reactive, the interfacial $SiO_x$ layer between the Si substrate and the metal oxide is reduced. Typically, the interfacial $SiO_x$ layer between the Si and $ZrO_x$ film is less than 10 A. In some embodiments, the water vapor ampoule temperature is set to about 1 C. The water vapor pulse time is about 10 seconds.

In operation 314, the unreacted reactant gas is purged from the chamber. The purge gas may be Ar and may have a flow rate of about 200 sccm. The purge time for the reactant may be about 70 seconds.

In operation 316, it is determined whether another ALD deposition cycle is to be performed. A typical ALD cycle may form a layer that is about 0.5 A. To form a 50 A metal oxide layer, about 100 cycles would need to be performed. If in operation 316, it is determined that the desired number of cycles has been performed or that the desired thickness has been reached, the process 300 continues to operation 318. If more ALD cycles need to be completed, the process 300 returns to operation 308.

Accordingly, the ALD $ZrO_x$ process of some embodiments uses ZyALD™ as Zr precursor and water vapor as the oxidizer. Using water vapor as the oxidizer has positive advantages over other commonly used oxidizers. The different level of oxygen vacancy defects created by depositing metal rich zirconium oxide film improves switching performance such as lower forming voltage and lower switching voltages. The resulting film stoichiometry (i.e. Zr:O atomic ratio) may be adjusted from about 1:2 (i.e. stoichiometric) to about 1:1.7 (i.e. metal rich). Advantageously, the resulting film stoichiometry (i.e. Zr:O atomic ratio) may be adjusted to about 1:1.88.

In operation 318, a second electrode is deposited over the metal oxide layer. In some embodiments, the second electrode may be a noble or near-noble metal such as iridium, iridium oxide, platinum, ruthenium, ruthenium oxide, titanium nitride, doped poly-silicon, tungsten or tantalum nitride. The second electrode may be deposited using PVD, ALD, CVD, PLD, evaporation, or other suitable technique.

Although the foregoing examples have been described in some detail for purposes of clarity of understanding, the invention is not limited to the details provided. There are many alternative ways of implementing the invention. The disclosed examples are illustrative and not restrictive.

What is claimed is:

1. A method for forming a resistive switching material, the method comprising:
   providing a substrate in a reaction chamber;
   a) applying a pulse of a zirconium precursor,
      wherein a portion of the zirconium precursor adsorbs on the substrate to form a first layer;
   b) purging a non-adsorbed portion of the zirconium precursor from the reaction chamber;
   c) applying a pulse of water vapor,
      wherein the water vapor reacts with the adsorbed portion of the zirconium precursor to form a metal-rich zirconium oxide material comprising oxygen vacancy defects,
      wherein the metal-rich zirconium oxide material has a zirconium to oxygen ratio of between about 1:1.7 and about 1:1.88;
   d) purging a non-reacted portion of the water vapor from the reaction chamber; and
   repeating steps a) through d) at least once.

2. The method of claim 1, wherein the pulsing of a zirconium precursor occurs for about 30 seconds with an argon carrier flow.

3. The method of claim 1 wherein the purging the zirconium precursor occurs with an argon carrier flow of about 200 sccm.

4. The method of claim 3, wherein the purge time is about 70 seconds.

5. The method of claim 1, wherein the pulsing the water vapor occurs for about 10 seconds with an argon carrier flow.

6. The method of claim 1 wherein the purging the water vapor occurs with an argon carrier flow of about 200 sccm.

7. The method of claim 6, wherein the purge time is about 70 seconds.

8. The method of claim 1 further comprising the step of heating the substrate to a temperature of about 250 C.

9. The method of claim 1 further comprising setting a temperature of a water vapor ampoule to 1 C.

10. The method of claim 9, wherein the water vapor has a vapor pressure of 4.9 torr.

11. The method of claim 1 further comprising using argon to reduce a partial pressure of the water vapor.

12. The method of claim 1, wherein the metal-rich zirconium oxide material has a thickness of 50 A.

13. The method of claim 1 further comprising forming an interfacial SiOx layer between the substrate and the metal-rich zirconium oxide material.

14. The method of claim 13, wherein the interfacial SiOx layer has a thickness less than 10 A.

15. The method of claim 1, wherein the deposition rate of steps a) through d) is about 0.5 angstrom per cycle.

16. The method of claim 15, wherein steps a) through d) are repeated 100 times.

17. The method of claim 1, wherein the oxygen vacancy defects are variances in charge in a structure of the metal-rich zirconium oxide material.

18. The method of claim 1, wherein the metal-rich zirconium oxide material is non-stoichiometric.

* * * * *